(12) United States Patent
Wada et al.

(10) Patent No.: US 8,679,646 B2
(45) Date of Patent: Mar. 25, 2014

(54) ORGANIC LIGHT-EMITTING DIODE, DISPLAY AND ILLUMINATING DEVICE

(75) Inventors: Atsushi Wada, Kawasaki (JP); Yukitami Mizuno, Tokyo (JP); Tomoaki Sawabe, Tokyo (JP); Isao Takasu, Tokyo (JP); Tomoko Sugizaki, Kawasaki (JP); Shintaro Enomoto, Yokohama (JP); Isao Amemiya, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 434 days.

(21) Appl. No.: 12/875,564

(22) Filed: Sep. 3, 2010

(65) Prior Publication Data

US 2011/0215304 A1 Sep. 8, 2011

(30) Foreign Application Priority Data

Mar. 8, 2010 (JP) ................................. 2010-051014

(51) Int. Cl.
*H01L 51/54* (2006.01)
*C09K 11/06* (2006.01)

(52) U.S. Cl.
USPC ........... 428/690; 428/917; 313/504; 313/506; 252/301.16; 257/40; 257/102; 257/E51.044

(58) Field of Classification Search
None
See application file for complete search history.

(56) References Cited

U.S. PATENT DOCUMENTS

2005/0221115 A1* 10/2005 Tsuboyama et al. .......... 428/690
2007/0207344 A1 9/2007 Kamatani et al.

FOREIGN PATENT DOCUMENTS

| JP | 2000-100482 A | 4/2000 |
| JP | 2008-179697 | 8/2008 |
| JP | 2008-303152 | 12/2008 |

OTHER PUBLICATIONS

Lutz M. Engelhardt, et al. "Lewis-base Adducts of Group 1B Metal(i) Compounds. Part 13. Crystal Structure Determinations of Tetrakis(triphenylphosphine)- copper(i) and -silver(i) Perchlorates, Bis(pyridine)bis(triphenyl-phosphine)copper(i) Perchlorate, (2,2'—Bipyridyl)bis(triphenyl-phosphine)copper(i) Perchlorate, and Tetrahydroboratobis-(triphenylphosphine)copper(i)-Pyridine (1/0.5)." J. Chem. Soc. Dalton Trans. pp. 125-133. 1985.

Peter C. Healy. "Bis(pyridine-kN)bis(triphenylphosphine-kP)copper(I) tetrafluoridoborate." Acta Crystallographica, E64, m607. 15 pages. 2008.

Combined Taiwanese Office Action and Search Report issued Apr. 12, 2013 in Taiwanese Patent Application No. 099129495 (with English-language translation).

* cited by examiner

*Primary Examiner* — Michael H Wilson
(74) *Attorney, Agent, or Firm* — Oblon, Spivak, McClelland, Maier & Neustadt, L.L.P.

(57) ABSTRACT

According to one embodiment, there is provided an organic light-emitting diode including an anode and a cathode arranged apart from each other, and an emissive layer interposed between the anode and the cathode and including a host material and an emitting dopant. The emitting dopant includes a copper complex represented by the formula (1):

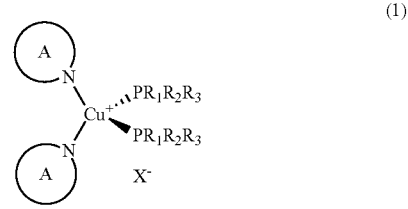

(1)

where $Cu^+$ represents a copper ion, the ligand A represents a pyridine derivative having nitrogen as a coordinate element and may have a substituent, $PR_1R_2R_3$ is a phosphine compound coordinating with $Cu^+$, where $R_1$, $R_2$ and $R_3$ may be the same or different, and represent a linear, branched or cyclic alkyl group having 6 or less carbon atoms or an aromatic cyclic group which may have a substituent, and $X^-$ represents a counter ion (counterion) where X represents F, Cl, Br, I, $BF_4$, $PF_6$, $CH_3CO_2$, $CF_3CO_2$, $CF_3SO_3$ or $ClO_4$.

3 Claims, 4 Drawing Sheets

ORGANIC LIGHT-EMITTING DIODE, DISPLAY AND ILLUMINATING DEVICE

CROSS-REFERENCE TO RELATED APPLICATIONS

This application is based upon and claims the benefit of priority from Japanese Patent Application No. 2010-051014, filed Mar. 8, 2010; the entire contents of which are incorporated herein by reference.

FIELD

Embodiments described herein relate generally to an organic light-emitting diode, display and illuminating device.

BACKGROUND

In recent years, organic light-emitting diodes have been attracting attention in view of luminescence technique for next generation displays and illumination. In the early study of organic light-emitting diodes, fluorescence has been mainly used. However, in recent years, an organic light-emitting diode utilizing phosphorescence which exhibits higher internal quantum efficiency has been attracting attention.

Mainstream of emissive layers utilizing phosphorescence in recent years are those in which a host material comprising an organic material is doped with an emissive metal complex including iridium or platinum as a central metal.

However, an iridium complex and platinum complex are rare metals and are therefore expensive, giving rise to the problem that organic light-emitting diodes using these rare metals are increased in cost. Copper complexes, on the other hand, likewise emit phosphorescent light and are inexpensive, so that they are expected to reduce the production cost.

For example, JP-A 2008-179697 (Kokai) discloses an organic light-emitting diode using a copper complex as a light-emitting material. However, the copper complex used here has the problem that the synthetic method is complicated.

DETAILED DESCRIPTION

In general, according to one embodiment, there is provided an organic light-emitting diode including an anode and a cathode arranged apart from each other; and an emissive layer interposed between the anode and the cathode and including a host material and an emitting dopant. The emitting dopant includes a copper complex represented by the formula (1):

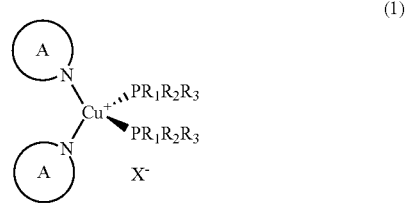

(1)

where $Cu^+$ represents a copper ion, the ligand A represents a pyridine derivative having nitrogen as a coordinate element and may have a substituent, $PR_1R_2R_3$ is a phosphine compound coordinating with $Cu^+$, where $R_1$, $R_2$ and $R_3$ may be the same or different, and represent a linear, branched or cyclic alkyl group having 6 or less carbon atoms or an aromatic cyclic group which may have a substituent, and $X^-$ represents a counter ion where X represents F, Cl, Br, I, $BF_4$, $PF_6$, $CH_3CO_2$, $CF_3CO_2$, $CF_3SO_3$ or $ClO_4$.

Embodiments of the present invention are explained below in reference to the drawings.

Figure 1:
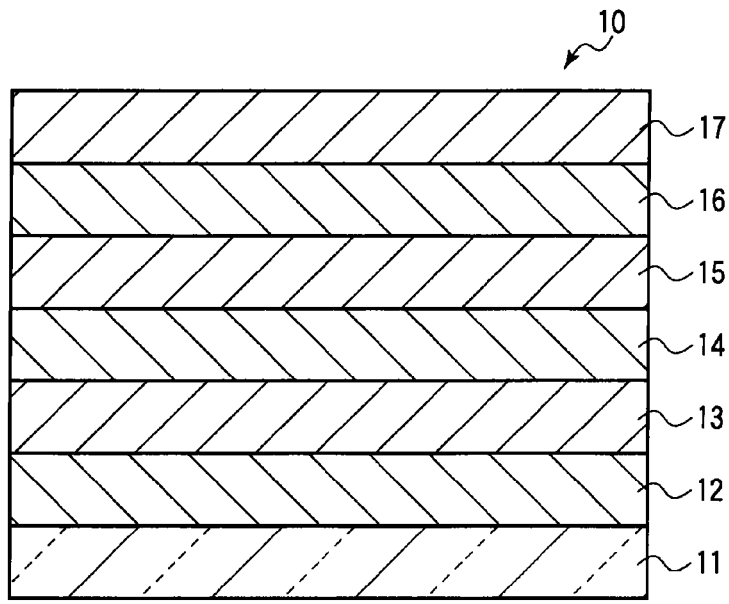
FIG. 1 is a cross-sectional view of an organic light-emitting diode of an embodiment.

FIG. 1 is a cross-sectional view of the organic light-emitting diode of an embodiment of the present invention.

In the organic light-emitting diode 10, an anode 12, hole transport layer 13, emissive layer 14, electron transport layer 15, electron injection layer 16 and cathode 17 are formed in sequence on a substrate 11. The hole transport layer 13, electron transport layer 15 and electron injection layer 16 are formed if necessary.

Each member of the organic light-emitting diode of the embodiment of the present invention is explained below in detail.

The emissive layer 14 receives holes and electrons from the anode and the cathodes, respectively, followed by recombination of holes and electrons which results in the light emission. The energy generated by the recombination excites the host material in the emissive layer. An emitting dopant is excited by energy transfer from the excited host material to the emitting dopant, and the emitting dopant emits light when it returns to the ground state.

The emissive layer 14 contains a luminescent metal complex (hereinafter, referred to as an emitting dopant), which is doped into the host material of an organic material. In this embodiment, a copper complex represented by the following formula (1) is used as an emitting dopant.

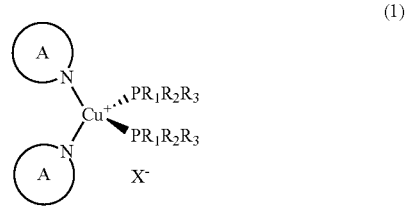

(1)

In the formula, $Cu^+$ represents a copper ion. A ligand A is a pyridine derivative having nitrogen as a coordinate element. Examples of the pyridine derivative include pyridine, quinoline and phenylpyridine. The above pyridine derivative may be substituted with a substituent such as an alkyl group, halogen atom or carboxy group. The above $PR_1R_2R_3$ is a phosphine compound coordinating with Cu⁺. $R_1$, $R_2$ and $R_3$ may be the same or different, and represent a linear, branched or cyclic alkyl group having 6 or less carbon atoms or an aromatic cyclic group which may have a substituent. Specific examples of the alkyl group include a methyl group, isopropyl group and cyclohexyl group. Specific examples of the above aromatic cyclic group include a phenyl group, naphthyl group and phenoxy group. X⁻ is a counter ion, wherein X represents F, Cl, Br, I, $BF_4$, $PF_6$, $CH_3CO_2$, $CF_3CO_2$, $CF_3SO_3$ or $ClO_4$.

The use of the copper complex as the emitting dopant enables the production of an organic light-emitting diode more reduced in cost than in the case of using an iridium complex or platinum complex. Further, the copper complex represented by the above formula (1) can be synthesized more easily than other copper complexes which are known to be used as the emitting dopant. Moreover, even in the case of using these copper complexes, an organic light-emitting diode having the same or higher luminous efficacy and luminance as compared with conventional organic light-emitting diodes can be provided.

Specific examples of the copper complex represented by the above formula (1) include copper complexes represented by the following formula (2).

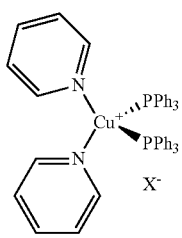

(2)

In the formula, X is $BF_4$ or $ClO_4$.

The copper complex represented by the above formula (2) is a known compound (ActaCryst. (2008). E64, m607 and J. Chem. Soc., Dalton Trans., 1985, 125-133). However, there is no precedent that this copper complex is used as the emitting dopant of organic light-emitting diodes.

As the emitting dopant, copper complexes represented by the following formula (3) may be used.

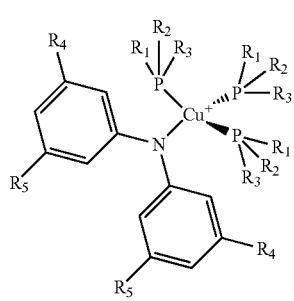

(3)

$R_1$, $R_2$ and $R_3$ are those defined in the above formula (1). $R_4$ and $R_5$ represent F or H and may both represent F provided that the both do not represent H at the same time.

There is no precedent that the copper complexes represented by the above formula (3) are used as the emitting dopant of organic light-emitting diodes. The copper complex represented by the formula (3) may be used as an emitting dopant having an emission wavelength shifted to a short wavelength, and therefore emits blue light. Further, the copper complex also has a high emission quantum yield. Therefore, when such a copper complex is used as an emitting dopant, an organic light-emitting diode having a high luminous efficacy and emitting blue light is obtained.

Specific examples of the copper complex represented by the formula (3) are shown below.

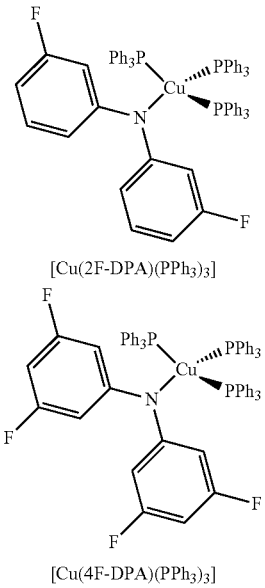

[Cu(2F-DPA)(PPh₃)₃]

[Cu(4F-DPA)(PPh₃)₃]

As the host material, a material having a high efficiency in energy transfer to the emitting dopant is preferably used. The host materials used when using a phosphorescent emitting dopant as the emitting dopant are roughly classified into a small-molecular type and a polymer type. An emissive layer containing a small-molecular host material is mainly formed by vacuum co-evaporation of a small-molecular host material and an emitting dopant. An emissive layer containing a polymer host material is formed by applying a solution obtained by blending the polymer host material with the emitting dopant as essential components. Typical examples of the small-molecular host material include 1,3-bis(carbazole-9-yl)benzene (mCP). Typical examples of the polymer host material include a polyvinylcarbazol (PVK). Besides the above materials, 4,4'-bis(9-dicarbazolyl)-2,2'-biphenyl (CBP), p-bis(triphenylsilyl)benzene (UGH2) and the like may be used as the host material in this embodiment.

In the case of using a host material having high hole-transport ability, the carrier balance between holes and electrons in the emissive layer is not maintained, giving rise to the problem concerning a drop in luminous efficacy. For this, the emissive layer may further contain an electron injection/transport material. In the case of using a host material having high electron-transport ability on the other hand, the emissive layer may further contain a hole injection/transport material. Such a structure ensures a good carrier balance between holes and electrons in the emissive layer, leading to improved luminous efficacy.

A method for forming the emissive layer 14 includes, for example, spin coating, but is not particularly limited thereto as long as it is a method which can form a thin film. A solution containing an emitting dopant and host material is applied in a desired thickness, followed by heating and drying with a hot plate and the like. The solution to be applied may be filtrated with a filter in advance.

The thickness of the emissive layer 14 is preferably 10-100 nm. The ratio of the host material and emitting dopant in the emissive layer 14 is arbitrary as long as the effect of the present invention is not impaired.

The substrate 11 is a member for supporting other members. The substrate 11 is preferably one which is not modified by heat or organic solvents. A material of the substrate 11 includes, for example, an inorganic material such as alkali-free glass and quartz glass; plastic such as polyethylene, polyethylene terephthalate (PET), polyethylene naphthalate (PEN), polyimide, polyamide, polyamide-imide, liquid crystal polymer, and cycloolefin polymer; polymer film; and metal substrate such as stainless steel (SUS) and silicon. In order to obtain light emission, a transparent substrate consisting of glass, synthesized resin, and the like is preferably used. Shape, structure, size, and the like of the substrate 11 are not particularly limited, and can be appropriately selected in accordance with application, purpose, and the like. The thickness of the substrate 11 is not particularly limited as long as it has sufficient strength for supporting other members.

The anode 12 is formed on the substrate 11. The anode 12 injects holes into the hole transport layer 13 or the emissive layer 14. A material of the anode 12 is not particularly limited as long as it exhibits conductivity. Generally, a transparent or semitransparent material having conductivity is deposited by vacuum evaporation, sputtering, ion plating, plating, and coating methods, and the like. For example, a metal oxide film and semitransparent metallic thin film exhibiting conductivity may be used as the anode 12. Specifically, a film prepared by using conductive glass consisting of indium oxide, zinc oxide, tin oxide, indium tin oxide (ITO) which is a complex thereof, fluorine doped tin oxide (FTC), indium zinc oxide, and the like (NESA etc.); gold; platinum; silver; copper; and the like are used. In particular, it is preferably a transparent electrode consisting of ITO. As an electrode material, organic conductive polymer such as polyaniline, the derivatives thereof, polythiophene, the derivatives thereof, and the like may be used. When ITO is used as the anode 12, the thickness thereof is preferably 30-300 nm. If the thickness is thinner than 30 nm, the conductivity is decreased and the resistance is increased, resulting in reducing the luminous efficiency. If it is thicker than 300 nm, ITO loses flexibility and is cracked when it is under stress. The anode 12 may be a single layer or stacked layers each composed of materials having various work functions.

The hole transport layer 13 is optionally arranged between the anode 12 and emissive layer 14. The hole transport layer 13 receives holes from the anode 12 and transports them to the emissive layer side. As a material of the hole transport layer 13, for example, polythiophene type polymer such as a conductive ink, poly(ethylenedioxythiophene):polystyrene sulfonate [hereinafter, referred to as PEDOT:PSS] can be used, but is not limited thereto. A method for forming the hole transport layer 13 is not particularly limited as long as it is a method which can form a thin film, and may be, for example, a spin coating method. After applying a solution of hole transport layer 13 in a desired film thickness, it is heated and dried with a hotplate and the like. The solution to be applied may be filtrated with a filter in advance.

The electron transport layer 15 is optionally formed on the emissive layer 14. The electron transport layer 15 receives electrons from the electron injection layer 16 and transports them to the emissive layer side. As a material of the electron transport layer 15 is, for example, tris[3-(3-pyridyl)-mesityl] borane [hereinafter, referred to as 3TPYMB], tris(8-hydroxyquinolinato)aluminum [hereinafter, referred to as Alq$_3$], and basophenanthroline (BPhen), but is not limited thereto. A method for depositing the electron transport layer 15 is similar to that for the hole transport layer 13.

The electron injection layer 16 is optionally formed on the electron transport layer 15. The electron injection layer 16 receives electrons from the cathode 17 and transports them to the electron transport layer 15 or emissive layer 14. As a material of the electron injection layer 16 is, for example, CsF, LiF, and the like, but is not limited thereto. A method for forming the electron injection layer 16 is similar to that for the hole transport layer 13.

The cathode 17 is formed on the emissive layer 14 (or the electron transport layer 15 or the electron injection layer 16). The cathode 17 injects electrons into the emissive layer 14 (or the electron transport layer 15 or the electron injection layer 16). Generally, a transparent or semitransparent material having conductivity is deposited by vacuum evaporation, sputtering, ion plating, plating, coating methods, and the like. Materials for the cathode include a metal oxide film and semitransparent metallic thin film exhibiting conductivity. When the anode 12 is formed with use of a material having high work function, a material having low work function is preferably used as the cathode 17. A material having low work function includes, for example, alkali metal and alkali earth metal. Specifically, it is Li, In, Al, Ca, Mg, Li, Na, K, Yb, Cs, and the like.

The cathode 17 may be a single layer or stacked layers each composed of materials having various work functions. Further, it may be an alloy of two or more metals. Examples of the alloy include a lithium-aluminum alloy, lithium-magnesium alloy, lithium-indium alloy, magnesium-silver alloy, magnesium-indium alloy, magnesium-aluminum alloy, indium-silver alloy, and calcium-aluminum alloy.

The thickness of the cathode 17 is preferably 10-150 nm. When the thickness is thinner than the aforementioned range, the resistance is excessively high. When the film thickness is thicker, long period of time is required for deposition of the cathode 17, resulting in deterioration of the performance due to damage to the adjacent layers.

Explained above is an organic light-emitting diode in which an anode is formed on a substrate and a cathode is arranged on the opposite side to the substrate, but the substrate may be arranged on the cathode side.

Figure 2:
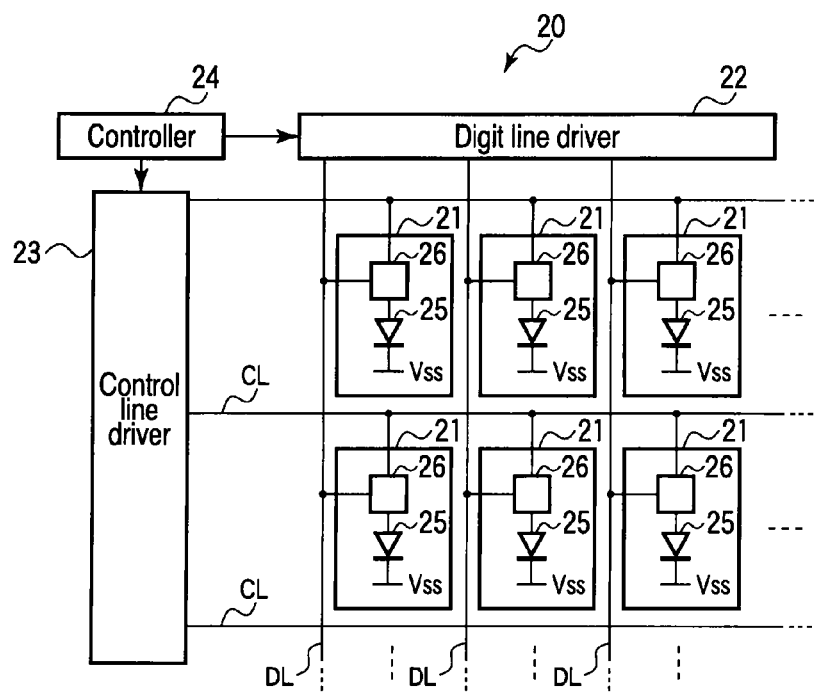
FIG. 2 is a circuit diagram showing a display of an embodiment.

FIG. 2 is a circuit diagram showing a display according to an embodiment.

A display 20 shown in FIG. 2 has a structure in which pixels 21 are arranged in circuits each provided with a lateral control line (CL) and vertical digit line (DL) which are arranged matrix-wise. The pixel 21 includes a light-emitting diode 25 and a thin-film transistor (TFT) 26 connected to the light-emitting diode 25. One terminal of the TFT 26 is connected to the control line and the other is connected to the digit line. The digit line is connected to a digit line driver 22. Further, the control line is connected to the control line driver 23. The digit line driver 22 and the control line driver 23 are controlled by a controller 24.

Figure 3:
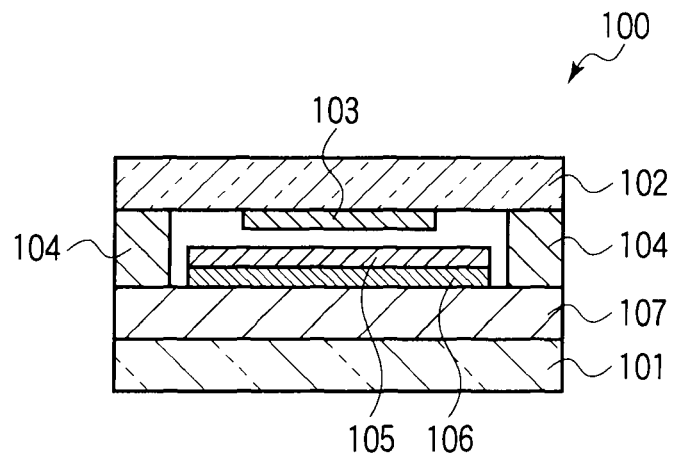
FIG. 3 is a cross-sectional view showing an illuminating device of an embodiment.

FIG. 3 is a cross-sectional view showing an illuminating device according to an embodiment.

An illuminating device 100 has a structure in which an anode 107, an organic light-emitting diode layer 106 and a cathode 105 are formed in this order on a glass substrate 101. A seal glass 102 is disposed so as to cover the cathode 105 and adhered using a UV adhesive 104. A drying agent 103 is disposed on the cathode 105 side of the seal glass 102.

EXAMPLES

Example 1

A synthetic example of a copper complex [Cu(py)$_2$(PPh$_3$)$_2$]BF$_4$ is shown below. [Cu(py)$_2$(PPh$_3$)$_2$]BF$_4$ has a structure in which pyridine (py) and triphenylphosphine (PPh$_3$) are coordinating with a copper ion.

(Reaction I)

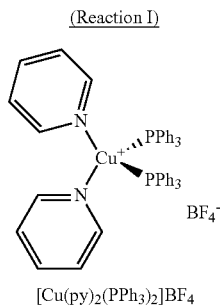

[Cu(py)$_2$(PPh$_3$)$_2$]BF$_4$ (Reaction I)

A 100 mL three-neck flask was charged with tetrakisacetonitrile copper (I) tetrafluoroborate (0.51 g, 1.62 mmol) and triphenylphosphine (0.85 g, 3.24 mmol), and the mixture in the flask was dried under vacuum. The atmosphere in the three-neck flask was substituted with nitrogen, and 25 mL of chloroform bubbled by nitrogen was added in the flask by using a syringe in which the atmosphere was substituted with nitrogen. After the mixture was stirred at ambient temperature for 6 hours, the reaction solution was filtrated to remove insoluble materials. When hexane was added to the filtrate, a white solid was precipitated. The precipitate was isolated by filtration to obtain [Cu(CH$_3$CN)$_2$(PPh$_3$)$_2$]BF$_4$ which was a target product (yield: 97%).

The reaction scheme of the above Reaction I is shown below.

(Reaction II)

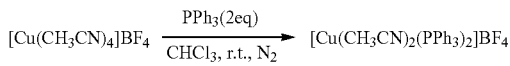

(Reaction II)

A 50 mL three-neck flask was charged with [Cu(CH$_3$CN)$_2$(PPh$_3$)$_2$]BF$_4$ (2.71 g, 3.58 mmol), and the mixture in the flask was dried under vacuum. The atmosphere in the three-neck flask was substituted with nitrogen, and 10 mL of chloroform bubbled by nitrogen was added in the flask by using a syringe in which the atmosphere was substituted with nitrogen. After the component in the solution was perfectly dissolved, 2 mL of pyridine was added to the solution. After the mixture was stirred at ambient temperature for 5 hours, the reaction solution was filtrated to remove insoluble materials. The solvent was removed, which was then dried under vacuum to obtain [Cu(py)$_2$(PPh$_3$)$_2$]BF$_4$ which was a target product, in the form of a white solid (yield: 84%). [Cu(py)$_2$(PPh$_3$)$_2$]BF$_4$ was dissolved in chloroform deuteride to measure the proton nuclear magnetic resonance spectrum. The chemical shift of the peak position (ppm): 8.37 (singlet), 7.81 (triplet) and 7.08-7.44 (multiplet).

The reaction scheme of the above Reaction II is shown below.

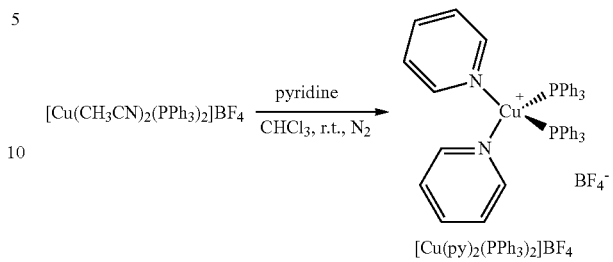

[Cu(py)$_2$(PPh$_3$)$_2$]BF$_4$

Figure 4:
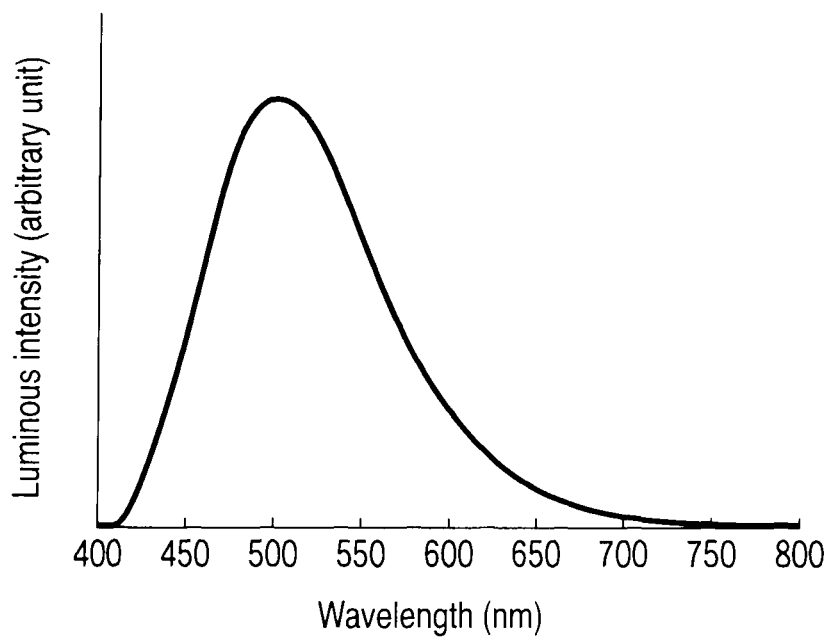
FIG. 4 is a view showing the PL spectrum of $[Cu(py)_2(PPh_3)_2]BF_4$.

The photoluminescence (PL) spectrum of [Cu(py)$_2$(PPh$_3$)$_2$]BF$_4$ obtained as above was measured. The spectrum was measured at ambient temperature in the solid state. The results are shown in FIG. 4. The above [Cu(py)$_2$(PPh$_3$)$_2$]BF$_4$ was excited by ultraviolet light having an excitation wavelength at 365 nm, and as a result, emitted bluish green light having a light-emitting peak at 501 nm.

The above synthesized [Cu(py)$_2$(PPh$_3$)$_2$]BF$_4$ was used as an emitting dopant to fabricate an organic light-emitting diode. The layer structure of this diode is as follows: ITO 100 nm/PEDOT:PSS 45 nm/PVK:OXD-7:[Cu(py)$_2$(PPh$_3$)$_2$]BF$_4$ 65 nm/3TPYMB 50 nm/CsF 1 nm/Al 150 nm.

The anode is a transparent electrode made of ITO (indium-tin oxide) 100 nm in thickness.

As the material of the hole-transport layer, an aqueous poly(ethylenedioxythiophene):poly(styrene.sulfonic acid) [PEDOT:PSS] solution which is conductive ink was used. An aqueous PEDOT:PSS solution was applied by spin coating, and dried under heating to form a hole-transport layer 45 nm in thickness.

As to the materials used for the emissive layer, a poly(vinylcarbazole) [PVK] was used as the host material, 1,3-bis(2-(4-tertiarybutylphenyl)-1,3,4-oxydiazole-5-yl)benzene[OXD-7] was used as the electron-transport material and [Cu(py)$_2$(PPh$_3$)$_2$]BF$_4$ was used as the emitting dopant. PVK is a hole-transport host material and OXD-7 is an electron-transport material. Therefore, if a mixture of these materials is used as the host material, electrons and holes can be efficiently injected into the emissive layer when voltage is applied. These compounds were weighed such that the ratio by weight of these compounds is as follows: PVK:OXD-7:[Cu(py)$_2$(PPh$_3$)$_2$]BF$_4$=60:30:10, and dissolved in chlorobenzene to obtain a solution, which was applied by spin coating, followed by drying under heating to form an emissive layer 65 nm in thickness.

The electron-transport layer was formed in a thickness of 50 nm by vapor evaporation of tris[3-(3-pyridyl)-mesityl]borane [3TPYMB]. The electron injection layer was formed of CsF 1 nm in thickness and the cathode was formed of Al 150 nm in thickness.

Figure 5A:
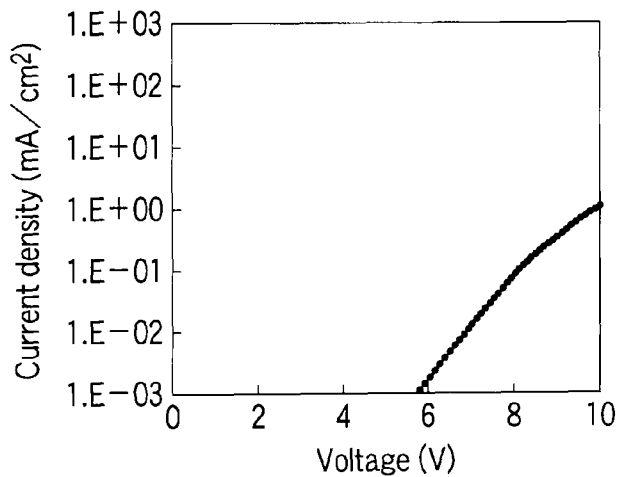
FIG. 5A is a view showing the relationship between the voltage and current density of the diode according to Example 1.
Figure 5B:
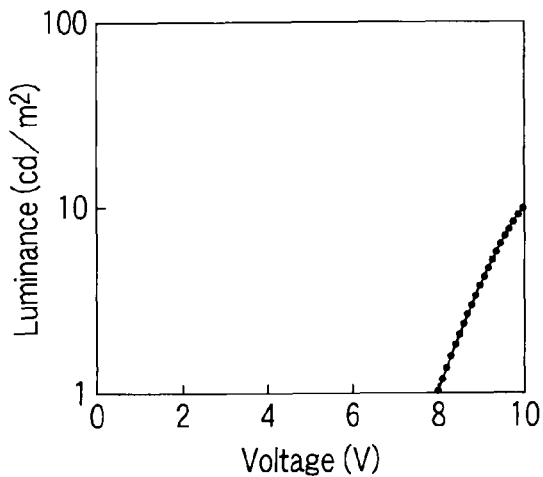
FIG. 5B is a view showing the relationship between the voltage and luminance of the diode according to Example 1.
Figure 5C:
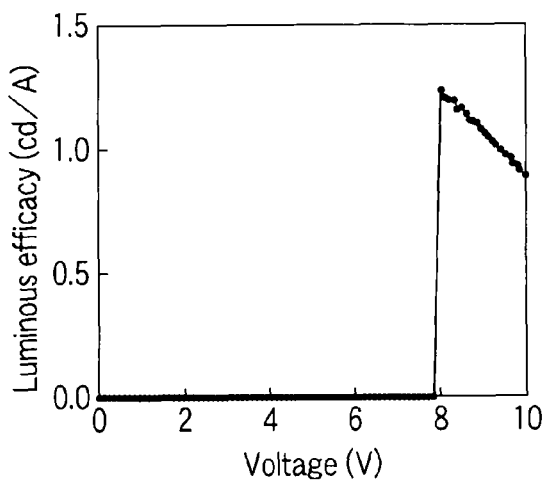
FIG. 5C is a view showing the relationship between the voltage and luminous efficacy of the diode according to Example 1.

The luminous characteristics of the organic light-emitting diode fabricated in the above manner were examined. FIG. 5A is a view showing the relationship between the voltage and current density of the diode according to Example 1. FIG. 5B is a view showing the relationship between the voltage and luminance of the diode according to Example 1. FIG. 5C is a view showing the relationship between the voltage and luminous efficacy of the diode according to Example 1. The luminous efficacy was obtained by simultaneous measurements of luminance, current and voltage. The luminance was measured using a Si Photodiode S7610 (trade name, manufactured by Hamamatsu Photonics K.K.) with a visibility filter. Further, the current and the voltage were measured using a Semiconductor Parameter Analyzer 4156b (trade name, manufactured by HEWLETT PACKARD).

Current density rose along with application of voltage and the light-emitting was started at 8 V. The luminance was 10 cd/cm$^2$ at 10 V and the maximum luminous efficacy was 1.3 cd/A.

Figure 6:
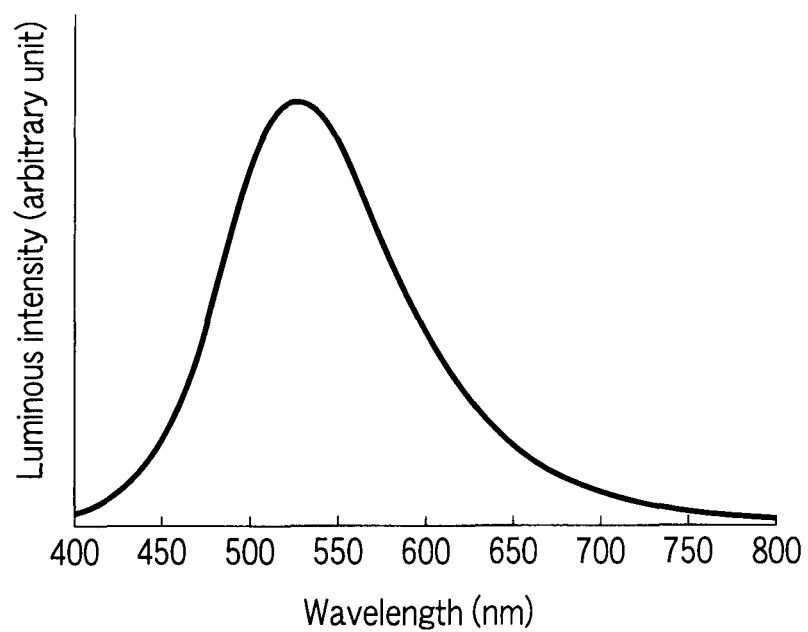
FIG. 6 is a view showing the EL spectrum of an organic light-emitting diode according to Example 1.

Further, the electroluminescence (EL) spectrum of the organic light-emitting diode according to Example 1 when voltage was applied was measured. The results are shown in FIG. 6. An EL spectrum having a light-emitting peak at 535 nm was obtained. From the above results, it was found that the copper complex according to this embodiment was useful as the emitting dopant of an organic light-emitting diode.

Example 2

A synthetic example of [Cu(2F-DPA)(PPh$_3$)$_3$] is shown below.

(Reaction I)

A 100 mL three-neck flask was charged with 50 mL of toluene, 3-fluorophenol (25.0 mmol) and 50 mL of an aqueous 30% potassium phosphate solution, and trifluoromethanesulfonic acid anhydride (30.0 mmol) was added dropwise to the solution in the condition that the reaction solution was kept at 10° C. or less. The reaction solution was stirred at ambient temperature for one hour and then extracted twice with 50 mL of ethyl acetate. The extract was washed with 150 mL of water, and magnesium sulfate was added to remove water, followed by vacuum drying to obtain a liquid compound 3-fluorophenyl trifluoromethanesulfonate.

(Reaction II)

A 100 mL three-neck flask was charged with palladium acetate (0.2 mmol), cesium carbonate (2.4 mmol) and 2-dicyclohexylphosphino-2',4',6'-triisopropylbiphenyl (0.3 mmol), and 40 mL of toluene was added to the mixture to dissolve these components. In succession, 3-fluorophenyl trifluoromethanesulfonate (2.0 mmol) and 3-fluoroaniline (2.2 mmol) were added to the solution, which was then stirred at 100° C. for 2 hours. The reaction solution was dried under vacuum and then purified by column chromatography (solvent is ethyl acetate:n-hexane=1:3) to obtain di-substituted fluorodiphenylamine (2F-DPA).

The reaction schemes of the above Reactions (I) and (II) are shown below.

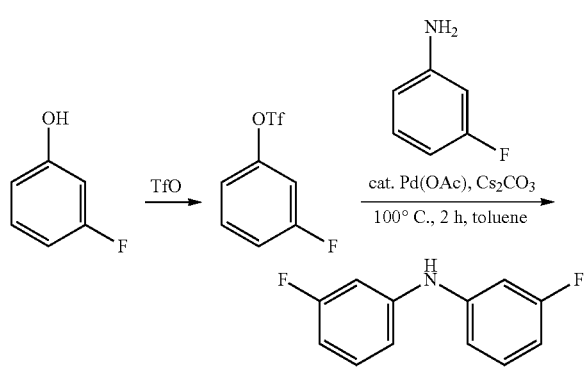

(Reaction III)

A 100 mL three-neck flask was charged with 2F-DPA, and tetrahydrofuran anhydrous was added to dissolve 2F-DPA. A 1.6 M nBuLi hexane solution was added to the 2F-DPA solution, which was then stirred at ambient temperature for 5 minutes, and then, cooled to −35° C. A separate 100 mL three-neck flask was prepared and charged with CuBr.Me$_2$S and triphenylphosphine (PPh$_3$). Tetrahydrofuran anhydrous was added to dissolve these components and the solution was cooled to −35° C. The prepared 2F-DPA solution was added to the solution containing CuBr.Me$_2$S and PPh$_3$ at −35° C., and the resulting solution was shielded from light. After the solution was stirred for 2 hours, the solvent was evaporated, followed by vacuum drying. The obtained solid was extracted with benzene and freeze-dried to obtain a target compound [Cu(2F-DPA)(PPh$_3$)$_3$].

The reaction scheme of the above Reaction (III) is shown below.

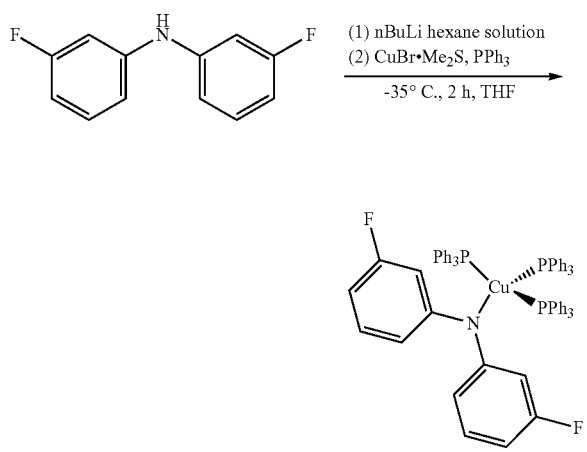

A synthetic example of [Cu(4F-DPA)(PPh$_3$)$_3$] is shown below.

(Reaction I)

A 100 mL three-neck flask was charged with 50 mL of toluene, 3,5-fluorophenol (25.0 mmol) and 50 mL of an aqueous 30% potassium phosphate solution, and trifluoromethanesulfonic acid anhydride (30.0 mmol) was added dropwise to the solution in the condition that the reaction solution was kept at 10° C. or less. The reaction solution was stirred at ambient temperature for one hour and then extracted twice with 50 mL of ethyl acetate. The extract was washed with 150 mL of water, and magnesium sulfate was added to remove water, followed by vacuum drying to obtain a liquid compound 3,5-difluorophenyl trifluoromethanesulfonate.

(Reaction II)

A 100 mL three-neck flask was charged with palladium acetate (0.2 mmol), cesium carbonate (2.4 mmol) and 2-dicyclohexylphosphino-2',4',6'-triisopropylbiphenyl (0.3 mmol) and 40 mL of toluene was added to the mixture to dissolve these components. In succession, 3,5-difluorophenyl trifluoromethanesulfonate (2.0 mmol) and 3,5-difluoroaniline (2.2 mmol) were added to the solution, which was then stirred at 100° C. for 30 minutes. The reaction solution was dried under vacuum and then purified by column chromatography (solvent: ethyl acetate:n-hexane=1:5) to isolate, thereby obtaining 4F-DPA.

The reaction schemes of the above Reactions (I) and (II) are shown below.

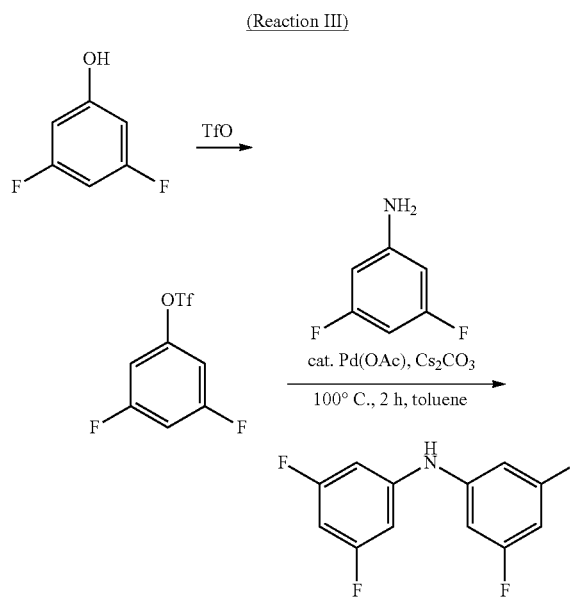

(Reaction III)
A 100 mL three-neck flask was charged with 4F-DPA and tetrahydrofuran anhydrous was added to dissolve 4F-DPA. A 1.6 M nBuLi hexane solution was added to the solution, which was then stirred at ambient temperature for 5 minutes, and then, cooled to −35° C. A separate 100 mL three-neck flask was prepared and charged with CuBr.Me$_2$S and triphenylphosphine (PPh$_3$). Tetrahydrofuran anhydrous was added to dissolve these components and the solution was cooled to −35° C. The prepared 4F-DPA solution was added to the solution containing CuBr.Me$_2$S and PPh$_3$ at −35° C. and the resulting solution was shielded from light. After the solution was stirred for 2 hours, the solvent was evaporated, followed by vacuum drying. The obtained solid was extracted with benzene and freeze-dried to obtain a target compound [Cu(4F-DPA)(PPh$_3$)$_3$].

The reaction scheme of the above Reaction (III) is shown below.

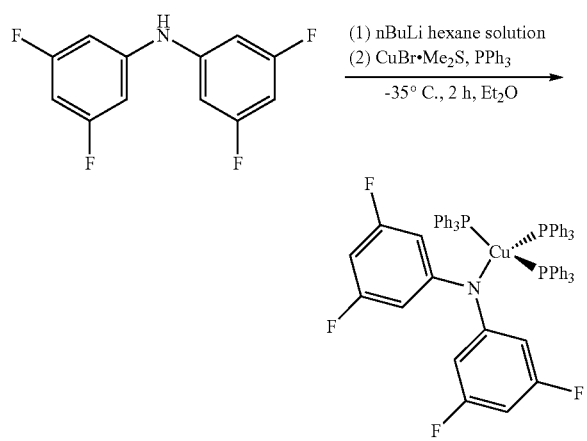

With regard to [Cu(2F-DPA)(PPh$_3$)$_3$], [Cu(4F-DPA)(PPh$_3$)$_3$] and [Cu(PN)(PPh$_3$)$_3$], molecular orbital calculations were performed to estimate the light-emitting wavelength. The structure of [Cu(PN)(PPh$_3$)$_3$] is shown below.

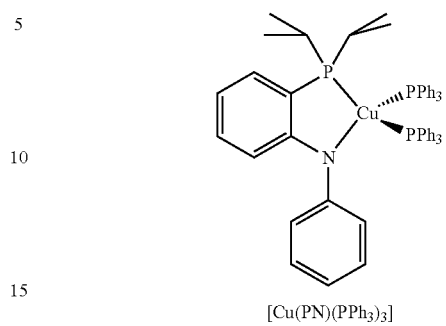

[Cu(PN)(PPh$_3$)$_3$]

This calculation was performed using the Gaussian 03 which is a molecular orbital calculation soft. First, structural optimization was performed according to the density functional method (B3LYP method) and then time dependent density functional method (TD-DFT) was performed by using this optimized structure to obtain light-emitting wavelength. As the basic function, LanL2DZ was used for Cu and 6-31G* was used for C, H, N and F.

As a result, each light-emitting wavelength was as follows: [Cu(PN)(PPh$_3$)$_3$]: 469.30 nm, [Cu(2F-DPA)(PPh$_3$)$_3$]: 434.57 nm and [Cu(4F-DPA)(PPh$_3$)$_3$]: 412.97 nm. As compared with the light-emitting wavelength of [Cu(PN)(PPh$_3$)$_3$], the light-emitting wavelength of [Cu(2F-DPA)(PPh$_3$)$_3$] in which two fluorine groups were introduced into specific positions was shifted by 35 nm to the shorter wavelength side and the light-emitting wavelength of [Cu(4F-DPA)(PPh$_3$)$_3$] in which four fluorine groups were introduced into specific positions was shifted by 56 nm to the shorter wavelength side. Accordingly, [Cu(PN)(PPh$_3$)$_3$] exhibits bluish green light at 504 nm of the light-emitting peak whereas [Cu(4F-DPA)(PPh$_3$)$_3$] emits blue light.

An organic light-emitting diode was fabricated in the same manner as in Example 1 except that [Cu(2F-DPA)(PPh$_3$)$_3$] and [Cu(4F-DPA)(PPh$_3$)$_3$] synthesized above was used as the emitting dopant.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An organic light-emitting diode comprising:
an anode and a cathode arranged apart from each other; and
an emissive layer interposed between the anode and the cathode and comprising a host material and an emitting dopant, wherein
the emitting dopant comprises a copper complex of formula (3):

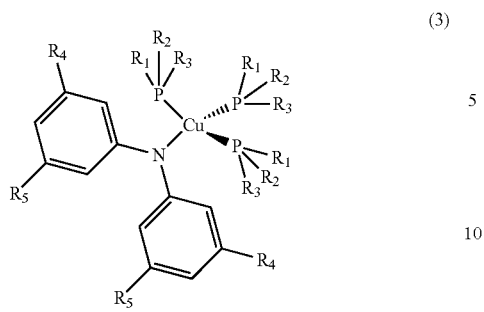

(3)

where $PR_1R_2R_3$ is a phosphine compound coordinating with $Cu^+$, $R_1$, $R_2$ and $R_3$ may be the same or different and are a linear, branched or cyclic alkyl group having 6 or less carbon atoms or an aromatic cyclic group which may have a substituent, and $R_4$ and $R_5$ are F or H and may both be F provided that both are not H at the same time.

2. A display comprising the organic light-emitting diode according to claim 1.

3. An illuminating device comprising the organic light-emitting diode according to claim 1.

* * * * *